US009920736B2

(12) United States Patent
Tang et al.

(10) Patent No.: US 9,920,736 B2
(45) Date of Patent: Mar. 20, 2018

(54) IGNITION CONTROL CIRCUIT WITH CURRENT SLOPE DETECTION

(71) Applicant: FAIRCHILD SEMICONDUCTOR CORPORATION, San Jose, CA (US)

(72) Inventors: Qingquan Tang, Breinigsville, PA (US); James E. Gillberg, Flemington, NJ (US)

(73) Assignee: Fairchild Semiconductor Corporation, San Jose, CA (US)

( * ) Notice: Subject to any disclaimer, the term of this patent is extended or adjusted under 35 U.S.C. 154(b) by 124 days.

(21) Appl. No.: 15/012,513

(22) Filed: Feb. 1, 2016

(65) Prior Publication Data

US 2016/0222939 A1    Aug. 4, 2016

Related U.S. Application Data

(60) Provisional application No. 62/111,242, filed on Feb. 3, 2015.

(51) Int. Cl.
| | |
|---|---|
| *F02P 17/12* | (2006.01) |
| *F02P 3/055* | (2006.01) |
| *F02P 3/05* | (2006.01) |
| *F02P 9/00* | (2006.01) |
| *F02P 3/045* | (2006.01) |

(Continued)

(52) U.S. Cl.
CPC ............... *F02P 17/12* (2013.01); *F02P 3/04* (2013.01); *F02P 3/0442* (2013.01); *F02P 3/0453* (2013.01); *F02P 3/051* (2013.01); *F02P 3/053* (2013.01); *F02P 3/0552* (2013.01); *F02P 9/002* (2013.01); *H03K 17/0828* (2013.01); *H03K 17/168* (2013.01); *F02P 3/055* (2013.01);

(Continued)

(58) Field of Classification Search
CPC .......... F02P 9/002; F02P 17/12; F02P 3/0453; F02P 3/051; F02P 3/053; F02P 3/0552; F02P 3/04; F02P 3/0442; F02P 3/055
USPC .......................................................... 123/644
See application file for complete search history.

(56) References Cited

U.S. PATENT DOCUMENTS

| | | | |
|---|---|---|---|
| 4,377,785 A | 3/1983 | Ueno et al. | |
| 2009/0139505 A1* | 6/2009 | Naito | F02P 3/0552 |
| | | | 123/644 |

(Continued)

FOREIGN PATENT DOCUMENTS

| | | |
|---|---|---|
| EP | 922856 A2 | 6/1999 |
| JP | 62195457 A | 8/1987 |
| JP | 03047476 A | 2/1991 |

*Primary Examiner* — Mahmoud Gimie
(74) *Attorney, Agent, or Firm* — Brake Hughes Bellermann LLP

(57) ABSTRACT

In a general aspect, a circuit for controlling operation of an ignition circuit including an insulated-gate bipolar transistor (IGBT) device can include a current slope detection circuit configured to detect a slope of a current in a primary winding of an ignition coil included in the ignition circuit and a driver circuit coupled with the current slope detection circuit. The current slope detection circuit can be further configured to, during charging of the ignition coil, if the detected slope is above a first limit, provide a first indication to the driver circuit; and, if the detected slope is below a second limit, provide a second indication to the driver circuit. The driver circuit can be configured to, in response to receiving the first indication or the second indication, modify operation of the ignition circuit.

18 Claims, 9 Drawing Sheets

(51) Int. Cl.
*F02P 3/04* (2006.01)
*H03K 17/082* (2006.01)
H03K 17/0812 (2006.01)
H03K 17/16 (2006.01)
H03K 17/691 (2006.01)

(52) U.S. Cl.
CPC ..... *H03K 17/08128* (2013.01); *H03K 17/166* (2013.01); *H03K 17/691* (2013.01)

(56) References Cited

U.S. PATENT DOCUMENTS

2012/0085327 A1    4/2012  Mizukami et al.
2013/0335864 A1*  12/2013  Trecarichi .............. F02P 3/051
                                                                  361/36

* cited by examiner

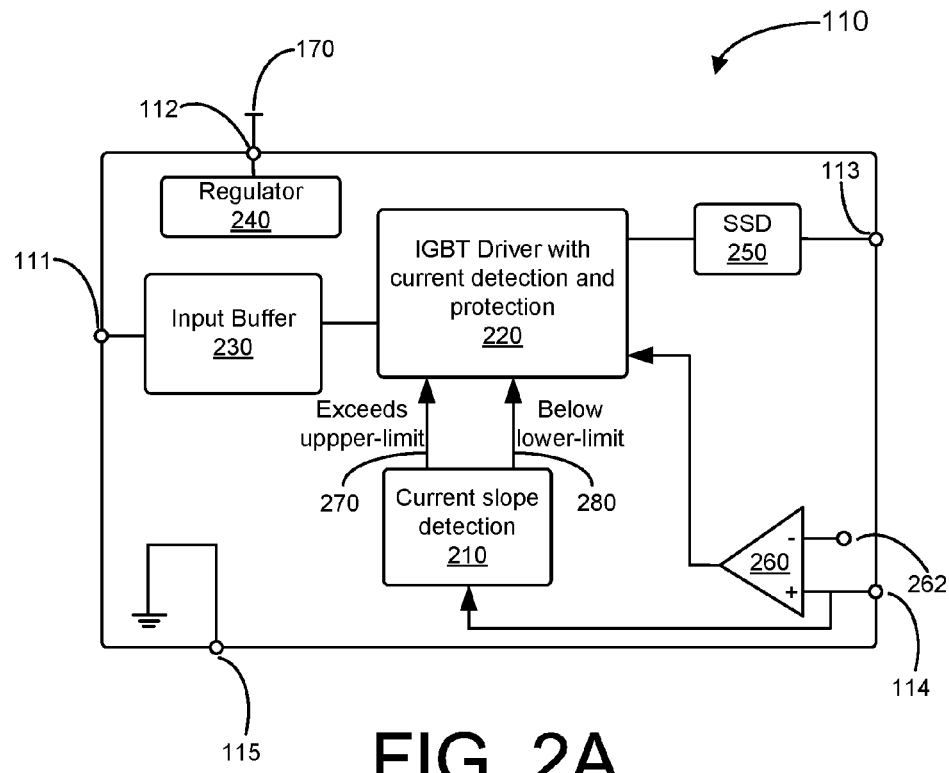
FIG. 2A
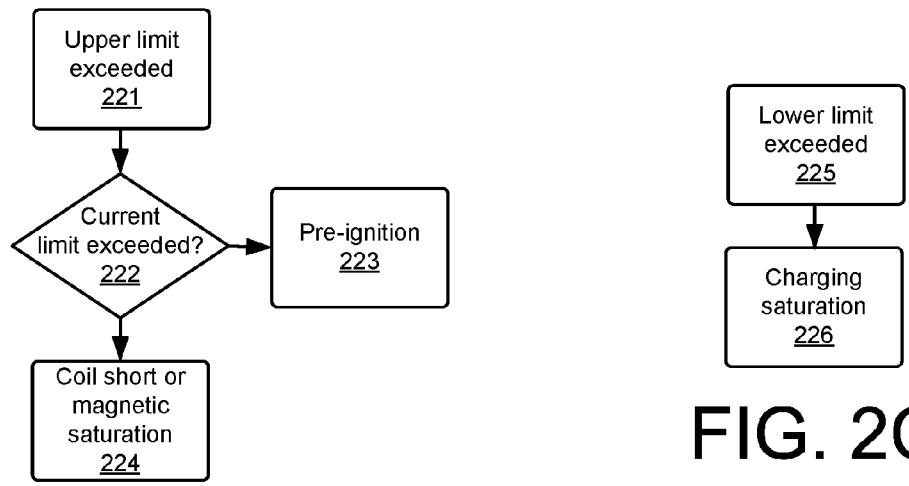
FIG. 2B
FIG. 2C

US 9,920,736 B2

IGNITION CONTROL CIRCUIT WITH CURRENT SLOPE DETECTION

RELATED APPLICATION

This application claims priority to and the benefit of U.S. Provisional Application No. 62/111,242, filed Feb. 3, 2015, entitled "Ignition Control Circuit with Current Slope Detection", the contents of which is hereby incorporated by reference in its entirety.

TECHNICAL FIELD

This description relates to control circuits that can be used in high-voltage circuits. In particular, the description relates to control circuits for use in inductive ignition circuits, such as in ignition systems for automotive applications (e.g., internal combustion engines).

SUMMARY

In an implementation, a circuit for controlling operation of an ignition circuit including an insulated-gate bipolar transistor (IGBT) device can include a current slope detection circuit configured to detect a slope of a current in a primary winding of an ignition coil included in the ignition circuit and a driver circuit coupled with the current slope detection circuit. The current slope detection circuit can be further configured to, during charging of the ignition coil, if the detected slope is above a first limit, provide a first indication to the driver circuit; and, if the detected slope is below a second limit, provide a second indication to the driver circuit. The driver circuit can be configured to, in response to receiving the first indication or the second indication, modify operation of the ignition circuit.

In another implementation, an ignition circuit for use in an internal combustion engine can include an ignition insulated-gate bipolar transistor (IGBT) circuit, an ignition coil coupled with the ignition IGBT circuit, a spark plug (or other sparking device) coupled with the ignition coil and a control circuit coupled with the ignition IGBT circuit. The control circuit can include a current slope detection circuit configured to detect a slope of a current in a primary winding of the ignition coil and a driver circuit coupled with the current slope detection circuit. The current slope detection circuit can be further configured to, during charging of the ignition coil, if the detected slope is above a first limit, provide a first indication to the driver circuit and, if the detected slope is below a second limit, provide a second indication to the driver circuit. The driver circuit can be configured to, in response to receiving the first indication or the second indication, modify operation of the ignition circuit.

BRIEF DESCRIPTION OF THE DRAWINGS

FIG. 2A is a schematic/block diagram of a control circuit that can be included in the ignition circuit of FIG. 1, according to an implementation.

FIGS. 2B and 2C are logic flow diagrams that can be implemented by the control circuit of FIG. 2A to identify failure modes of the ignition circuit in FIG. 1, according to implementations.

In the drawings, like elements are referenced with like reference numerals.

DETAILED DESCRIPTION

Figure 1:
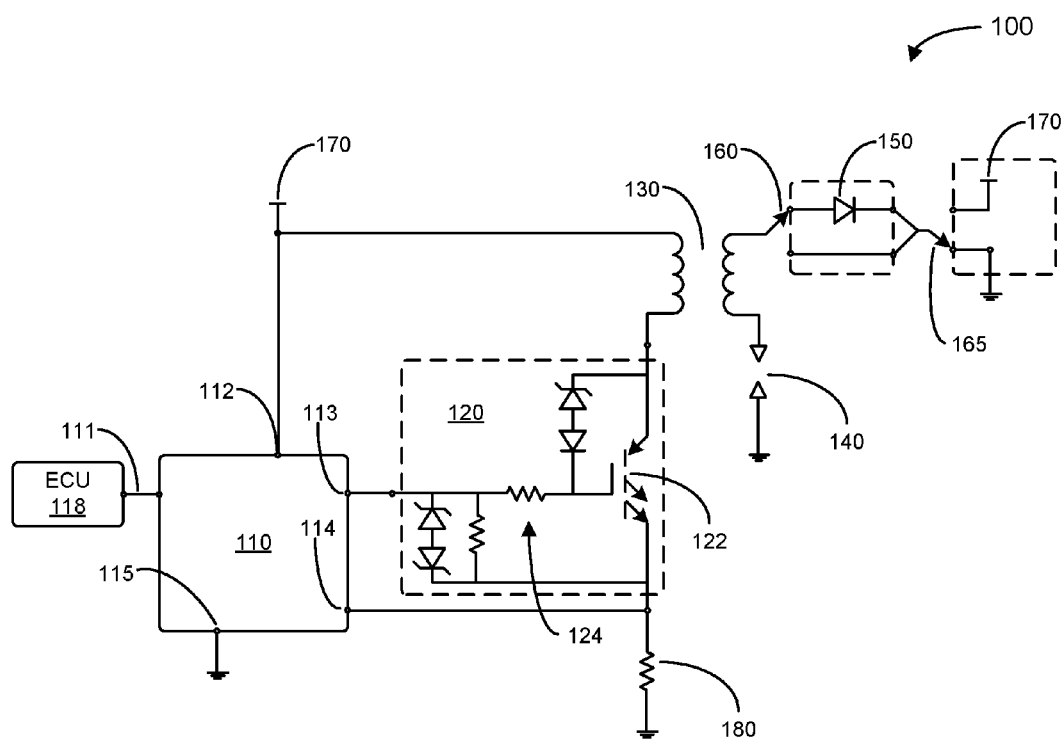
FIG. 1 is a schematic/block diagram of an ignition circuit, according to an implementation.

In inductive discharge ignition systems, such as circuits and/or systems that are used to ignite a fuel mixture in a cylinder of an internal combustion engine, a current in a primary winding (e.g., an inductor) of an ignition coil (e.g., a magnetic core transformer), which can be referred to as a primary current, can be dependent on a battery voltage ($V_{bat}$) of a corresponding vehicle, a conduction voltage of a semiconductor switch (e.g., an insulated-gate bipolar transistor (IGBT)) that is used to control charging and discharging of the ignition coil (e.g., through a secondary winding of the ignition coil), an inductance of the ignition coil's primary winding, a resistance of the primary winding and a charging time of the primary winding. In such an ignition circuit, changes in the primary current (as compared to the primary current expected during normal operation) can indicate improper operation of the ignition system, which may be caused by failure of one or more components in an associated ignition circuit and/or the operating parameters of the ignition circuit. In ignition circuit implementations, a ratio of a number of windings in the primary coil to a number of windings in the secondary coil can vary. For instance, the number of windings in the primary coil can be less than the number of windings in the secondary coil (e.g., step-up). In other implementations, the number of windings in the primary coil can be greater than the number of windings in the secondary coil (e.g., a step-down). In still other implementations, the number of windings in the primary coil can be equal to (e.g., substantially equal to) the number of windings in the secondary coil.

Such changes in primary current can indicate deterioration of components in such an ignition circuit, which can, in turn, result in a current that is above a desired current level (overcurrent), or can indicate that energy is being dissipated unnecessarily in an ignition coil. Such overcurrents, or unnecessary (or undesirable) energy dissipation, can cause damage to the ignition coil (e.g., the primary winding) and/or an IGBT that is used as a switch to control charging and discharging of the primary winding (hereafter ignition IGBT). Such damage or failure conditions may cause the ignition circuit to not function properly and/or could result in hazardous conditions, such as a fire.

Current implementations of ignition circuits include control circuits, which can be implemented as integrated circuits (ICs or control ICs), that can detect occurrence of failures or unwanted behavior of an ignition circuit based only on current levels in a primary winding of an ignition coil. For instance, such control ICs may operate so as to limit current through the ignition coil's primary winding and an associated ignition IGBT when the current level exceeds an upper current limit established by the control IC (or an associated voltage reference circuit). For example, a control IC may limit the primary current by operating the ignition IGBT in a linear operation mode (e.g., to increase resistance in the primary winding's charging current path).

Also, some current ignition circuit control ICs can implement a function that is used to detect a time span between two primary current levels (i.e., current levels in a primary winding). In such an approach, the control IC can have a signal pin (e.g., a Flag pin) that is used to indicate results of such a detection function. For instance, when a current in the primary winding reaches a first level (e.g., a lower limit), a signal on the Flag pin can transition from a high level (e.g., logic '1') to a low level (e.g., logic '0'). Then, when the primary winding current of the ignition coil reaches a second level (e.g., an upper limit), the Flag signal can transition from the low to the high level. This can allow for the time span between two primary winding current levels to be determined by measuring the pulse-width of the Flag signal, at its low level, during a single ignition cycle. Such functions, however, have limited capability to detect faulty operation of an ignition circuit.

Current control ICs may also implement a soft-shut-down (SSD) function. In implementing such SSD functions, a timer can be used to determine how long an ignition IGBT has been turned on and charging its associated primary ignition coil winding (or ignition coil). In such implementations, the control IC can turn off the ignition IGBT (e.g., in a controlled fashion to prevent large voltage and/or current spikes on a secondary side or winding of the ignition coil) after a pre-set time is reached (e.g., after the timer has timed out).

Such SSD functions can be used to attempt to prevent damage or hazardous conditions caused as a result of continuing to draw current through the primary winding of the ignition coil (and an associated ignition IGBT) once the primary winding is fully charged (which can be referred to as charging saturation) and/or when the magnetic core of the ignition coil has been magnetically saturated. Current control ICs are not, however, capable of detecting ignition coil charging saturation and/or ignition coil magnetic saturation. Therefore, if such an event occurs before the timer used to implement the SSD function has timed out, damage to the ignition circuit and/or hazardous conditions may occur (e.g., after operation under such conditions for an extended period of time).

Another undesirable condition in automotive ignition systems is the occurrence of pre-ignition events, where an air/fuel mixture in an engine cylinder ignites before the associated spark plug (or spark device) is fired by the ignition circuit. Such pre-ignition events are typically initiated by an ignition source other than the ignition circuit firing the spark plug. For instance, pre-ignition events can be caused by hot spots in an engine's combustion chamber, a spark plug that runs too hot for a particular engine, and/or carbonaceous deposits in the combustion chamber that are heated to incandescence by previous engine combustion events. Such events cannot be detected by control ICs that only use current level measurements in a primary ignition coil winding to detect occurrence of failures or unwanted behavior of an ignition circuit.

The implementations of control ICs for use in ignition circuits (e.g. that include ignition IGBTs) that are described herein can overcome, at least some of, the drawbacks of current approaches. As described below, such control ICs can include a circuit that is configured to detect changes in slope for a current in a primary winding of an ignition coil that is implemented in an ignition circuit. Such current slope detection can be used (in a control circuit or IC) to identify unexpected changes in primary winding current which, in turn, can be used to detect malfunctions or failure modes (such as those described herein, including charging saturation, magnetic saturation, a shorted primary winding and/or pre-ignition events) in an ignition circuit, and to send a warning or failure signal to a corresponding engine control unit (ECU), where the ECU can then take some action or actions to protect the ignition system by controlling an associated IGBT. In some implementations, a control IC can be configured to actively control an ignition IGBT (e.g., in response to detection of a malfunction or failure mode), rather than signaling an ECU. For instance, the control IC could initiate an SSD function of an ignition control circuit, disable a gate driver for an ignition IGBT, and so forth. The particular action or actions that are taken in response to detection of failure modes in an ignition control circuit using the techniques described herein will depend on the particular implementation.

FIG. 1 is a schematic/block diagram that illustrates an example implementation of an ignition control circuit (ignition circuit or circuit) 100. As shown in FIG. 1, the ignition circuit 100 includes a control IC 110 and an ignition IGBT 120. The ignition IGBT 120, as shown in FIG. 1, can include an IGBT device 122 and a resistor-diode network (network) 124. The network 124 can be configured to define a high-voltage clamp for the ignition circuit 100. As shown in FIG. 1, the ignition circuit 100 can also include an ignition coil 130 (e.g., a magnetic-core transformer) and a spark plug 140. In the embodiment of FIG. 1, the ignition circuit 100 is illustrated with a high voltage diode 150 that is connected to a secondary winding of the ignition coil 130. The diode 150 can be used to suppress transient voltage spikes in the secondary winding of the ignition coil 130 at the beginning of a charging period (dwell time or dwell period) of the ignition coil. In some implementations, the diode 150 can be omitted and/or other transient suppression approaches can be used.

The ignition circuit 100 of FIG. 1 also includes a resistor 180 (which can be referred to as a sense resistor or $R_{sense}$), which can be used, based on a time varying voltage across the resistor 180, to determine a primary current in the ignition coil 130 and also to detect changes in a slope of the primary current, e.g., to detect improper function and/or failures in the ignition control circuit 100, such as the failure modes discussed herein.

As shown in FIG. 1, the control IC (control circuit) 110 can include a plurality of terminals. For instance, in the circuit 100, the control IC 110 includes terminals 111, 112, 113 114 and 115. These terminals can each be a single terminal or can include respective multiple terminals, depending on the particular implementation and/or the particular terminal. For instance, in the control IC 110, the terminal 111 can include multiple terminals that are coupled with an engine control unit (ECU) 118 to receive and/or send signals to the ECU 118. For instance, the ECU 118 may communicate a signal (or signals) to the control IC 110 via the terminal 111 (e.g., on a first terminal of the multiple terminals of terminal 111) that is used to control charging of the ignition coil 130 and firing of the spark plug 140 (e.g. after charging the ignition coil 130 using energy stored in the ignition coil 130).

In an implementation, a second terminal of the multiple terminals of terminal 111 can be used to communicate one or more signals, from the circuit 100 to the ECU 118, that indicate occurrence of a failure mode, such as those discussed herein, and/or to indicate that the circuit 100 is operating normally or as expected. In other implementations, the terminal 111 could be a single bi-directional terminal configured to both send and receive signals, such as the signals described herein.

In FIG. 1, the terminal 112 of the control IC 110 can be a power supply terminal that receives a battery voltage ($V_{bat}$) 170, such as from a battery of a vehicle in which the ignition circuit 100 is implemented. In the control IC 110, the terminal 113 may be used to provide a signal that controls a gate of the IGBT device 122 (e.g. to control charging of the ignition coil 130 and firing of the spark plug 140).

As shown in FIG. 1, a switch 165 can be used to switch between the battery voltage 170 and electrical ground. Likewise, a switch 160 can be used to switch the diode 150 in and out of the ignition coil 130's charging/discharging circuit (e.g., to remove the diode from the charging/discharging circuit). The switches 160 and 165 can be used to configured the charging/discharging circuit of the ignition circuit 100 for a particular implementation.

The terminal 114 of the control IC 110 can be configured to receive a voltage signal (e.g., a voltage across the resistor 130 of the ignition circuit 100), where the voltage signal received at terminal 114 (e.g., a voltage across the $R_{sense}$ resistor 180 over each ignition cycle, which can be referred to as a $V_{sense}$ signal) can be used for current slope detection for a current through a primary winding of the ignition coil 130, such as using the approaches described herein. Further in FIG. 1, the terminal 115 of the control IC 110 can be a ground terminal that is connected with an electrical ground for the circuit 100.

FIG. 2A is a schematic/block diagram that illustrates an example implementation of the control IC 110 of FIG. 1. Accordingly, for purposes of illustration, the control circuit 110 of FIG. 2A will be described with further reference to FIG. 1. The control circuit of FIG. 2A can, however, be used in ignition control circuits having other configurations.

As shown in FIG. 2A, the control IC 110 can include a current slope detection circuit 210, an IGBT driver with current detection and protection (IGBT circuit) 220, an input buffer 230, a voltage regulator 240, a SSD function circuit 250 and a comparator 260. Each of the elements in FIG. 2A can be implemented in a number of ways, and the specific configuration of a given element can depend on the particular embodiment in which it is implemented. For instance, some example implementations of the current slope detection circuit 210 are disclosed herein, such as in FIGS. 3, 9 and 11. The circuits in those drawings are given by way of example, and other approaches are possible.

The input buffer 230 of the circuit 110 in FIG. 2A can be configured to a receive a control signal from the ECU 118 (e.g., a signal to control charging of the ignition coil 130 and firing of the spark plug 140), where that control signal, in the ignition circuit 100, is used to control a gate terminal of the IGBT device 120 to effect charging of the ignition coil 130 and firing of the spark plug 140, in addition to facilitating detection of failure modes and improper operation of the ignition circuit 100. The voltage regulator 240, when implemented in the circuit 100, can receive the battery voltage 170 and, based on that battery voltage, provide each of the reference voltages and direct-current voltages used in the control IC 110 of FIG. 2A, e.g., such as those discussed with reference to FIG. 2A through FIG. 12. For instance, in an implementation, the regulator 240 can be a linear voltage regulator. In other implementations, the regulator 240 can take other forms. Further, the approaches described herein for producing reference and direct-current (DC) voltages are given for purposes of illustration, and by way of example, and other techniques can be used.

When using the control IC 110 of FIG. 2A to detect changes in the primary winding current (current slope) of the ignition coil 130 of the circuit 100 of FIG. 1 (or similar circuits), the following relationships can be important to consider. For example, one such relationship is the relationship between a conduction voltage of the ignition IGBT and the primary current of the ignition coil 130 (e.g., that flows through the IGBT device 122) can be approximately given as:

$$v_{ce} = v_0 + k*i \quad \text{Equation 1}$$

where $v_{ce}$ is a collector-to-emitter voltage of the IGBT device 122 and i is a value of the primary current. In Equation 1, $v_o$ is, approximately, a diode or junction voltage, and k is a slope value of current at voltages greater than $v_o$.

In the foregoing example, i can be calculated by Equation 2 below:

$$i = \frac{(v_{bat} - v_0)}{R_L + k}\left(1 - e^{-\frac{R_L+k}{L}t}\right) \quad \text{Equation 2}$$

where $v_{bat}$ is a battery voltage of a vehicle used to charge the ignition coil 130 (e.g., the battery voltage 170 of the circuit 100), $R_L$ is a resistance of the primary winding, L is an inductance of the primary winding, t is time and e is the base of the natural logarithm.

Figure 5A:
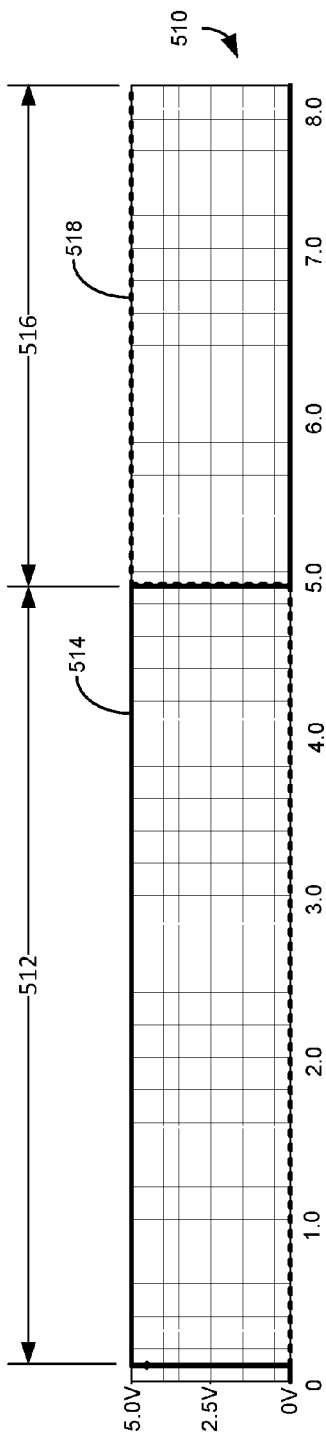
FIGS. 5A-5C are graphs illustrating normal operation of the ignition circuit of FIG. 1 when implemented with the control circuit of FIG. 2A and the slope detection circuit of FIG. 3, according to an implementation.

Accordingly, the slope of the primary current of the ignition coil 130 during a dwell period, such as shown in FIG. 5A, can be given, approximately, by Equation 3 below:

$$\frac{di}{dt} = \frac{(V_{bat} - V_0)}{L} e^{-\frac{R_L+k}{L}t} \quad \text{Equation 3}$$

Where a maximum value of di/dt (e.g. during normal operation) can occur at a beginning of a dwell period (e.g., causing a transient voltage spike). This maximum can be given by Equation 4 below:

$$\max\left(\frac{di}{dt}\right) = \frac{(V_{bat} - V_0)}{L} \qquad \text{Equation 4}$$

In view of these relationships, the control IC 110 in FIG. 2A can be used to detect improper operation of the ignition circuit 100 of FIG. 1 based on detecting (with the current slope detection circuit 210) unexpected changes in a slope of the primary current of the ignition coil 130 (e.g., as compared to normal operation). Examples of such improper operation and failure modes, and approaches for detecting occurrence of those improper operations and/or failure modes using the control IC 110 (e.g., by the current slope detection circuit 210) are described herein, such as with respect to FIGS. 2B, 2C, 6A-6C, 7A-7C and 8A-8C, for example.

In implementations, the detection of such improper operation and/or failure mode events can be indicated to (e.g., can be used to trigger) an IGBT circuit 220 of the control IC 110 (as well as other circuits or components, such as the ECU 118, an SSD function circuit 250, and so forth) by the current slope detection circuit 210, by the IGBT circuit 220, among other possible approaches for providing such indications.

For instance, as shown in FIG. 2A, such indications (e.g., triggering signals) may be provided using an exceeds upper-limit signal on a terminal 270 and a below lower-limit signal on a terminal 280. The exceeds upper-limit signal and the below lower-limit signal are given by way of example and other signals could be used. That is, the signal on terminal 270 (signal 270) can be used to indicate whether an upper limit of the current slope detection circuit 210 has been violated, while the signal on the terminal 280 (signal 280) can be used to indicate whether a lower limit of the current slope detection circuit has been violated. For example, the signals 270 and 280 may be logic 1 if their corresponding limit has been violated, and be logic 0 if their corresponding limit has not violated. The exceeds upper-limit signal and the below lower-limit signal being logic 1 or logic 0 are given by way of example, and other signaling approaches can be used. Accordingly, if neither of the signals 270 or 280 is set to logic 1, this may indicate the ignition circuit 100 is operating as expected.

When improper operation or a failure mode is detected in the ignition circuit 100, the circuit 220 (or other circuit of the control IC 110) can provide an appropriate indication to the ECU 118. The ECU 118 can then take one or more actions in response to the indication, where those actions will depend, at least in part, on the particular improper operation or failure mode that is indicated. In other approaches, the circuit 220 (or other circuit of the control IC 110) may take one or more actions (e.g., change operation of the ignition IGBT) in response to the indication of detection of improper operation or detection of a failure mode, such as triggering the SSD function circuit 230 to disable the IGBT device 122 of the ignition circuit 100, operating the IGBT device 122 in a linear mode, immediately disable the IGBT device 122, and/or so forth.

Figure 5B:
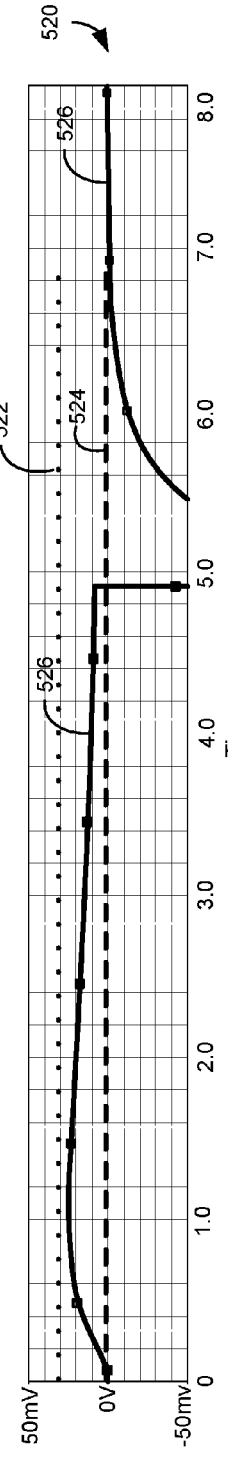
Figure 5C:
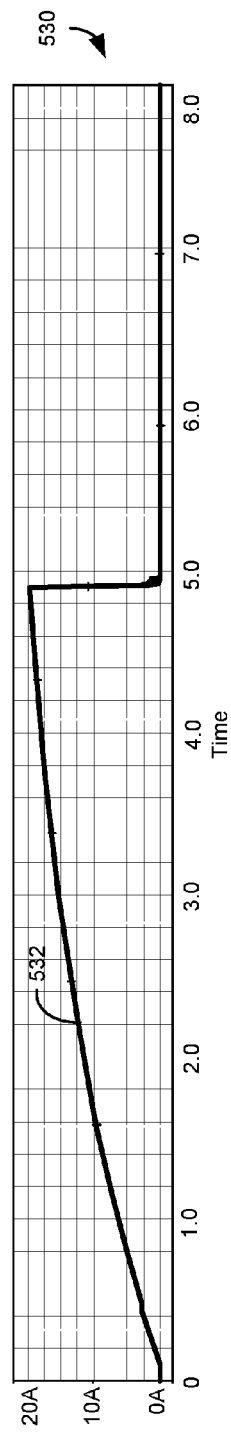
Figure 6A:
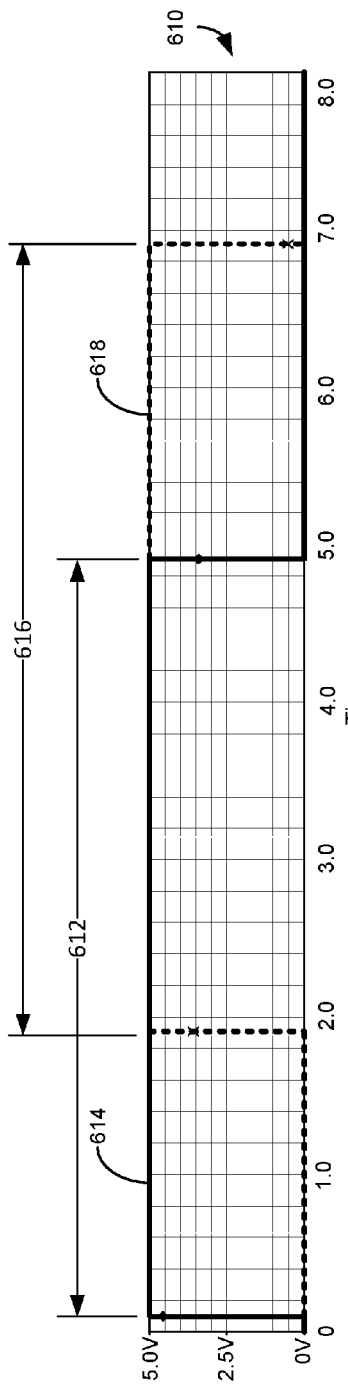
FIGS. 6A-6C are graphs illustrating operation of the ignition circuit of FIG. 1 when implemented with the control circuit of FIG. 2A and the slope detection circuit of FIG. 3 during detection of a pre-ignition event, according to an implementation.
Figure 6B:
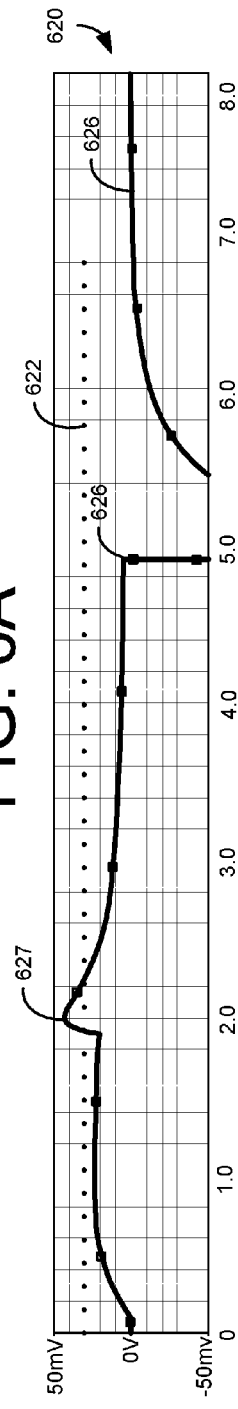
Figure 6C:
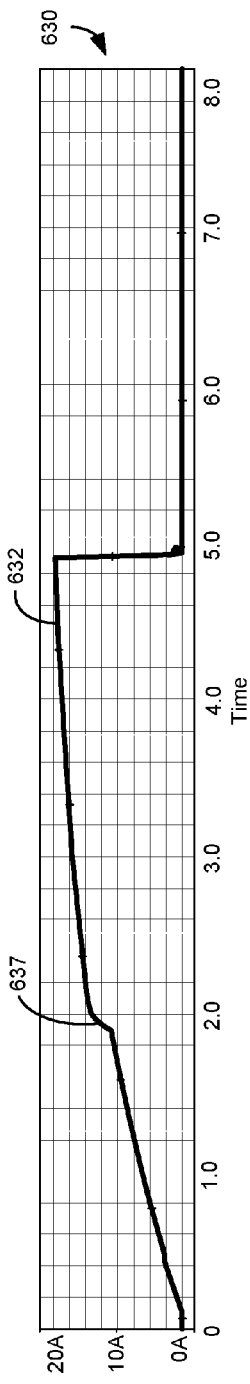

In ignition circuits that do not include the high voltage diode 150 (e.g., in the ignition circuit 100, by bypassing the diode 150 using, for example, the switch 160), the control IC 110 (and the current slope detection circuit 210) can be used to detect pre-ignition events based on an unexpected change in a slope of the primary winding current, such as illustrated by the example simulation results illustrated in FIGS. 6A-6C (as compared with the simulation result of normal operation shown in FIGS. 5A-5C). Briefly, as compared with normal operation, as illustrated by the example simulation results in FIGS. 5A-5C, occurrence of a pre-ignition condition (FIGS. 6A-6C) will cause a sudden increase, during the dwell period, in the primary winding current of the ignition coil 130 at a start of a pre-ignition condition (event). For instance, in the control circuit 110 of FIG. 2A, such pre-ignition events can be detected by, e.g., the current slope detection circuit 210 detecting that the upper limit has been violated and the comparator 260 indicating that the sense voltage on the terminal 114 is below a reference value corresponding with a current limit, which can be represented by a reference voltage applied to a terminal 262 of the comparator 260 and compared with the sense voltage applied to the terminal 114 of the control circuit 110.

Figure 7A:
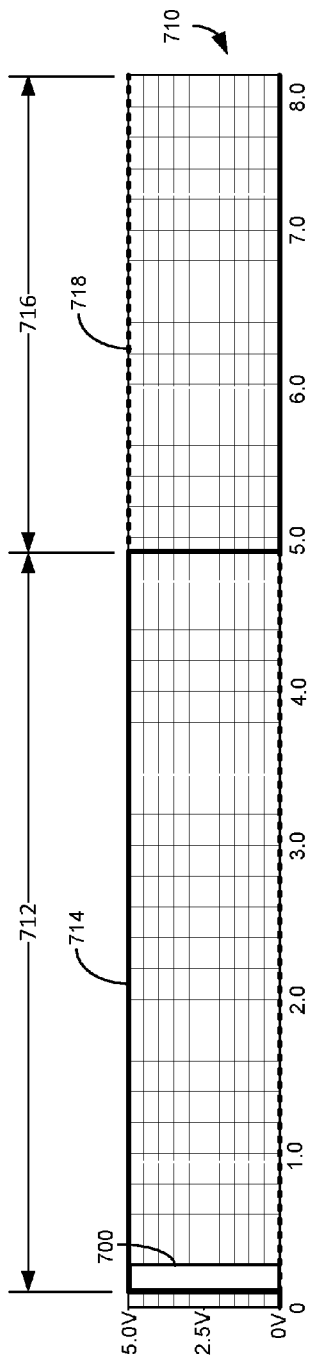
FIGS. 7A-7C are graphs illustrating operation of the ignition circuit of FIG. 1 when implemented with the control circuit of FIG. 2A and the slope detection circuit of FIG. 3 during detection of charging saturation of a primary ignition coil winding, according to an implementation.
Figure 7B:
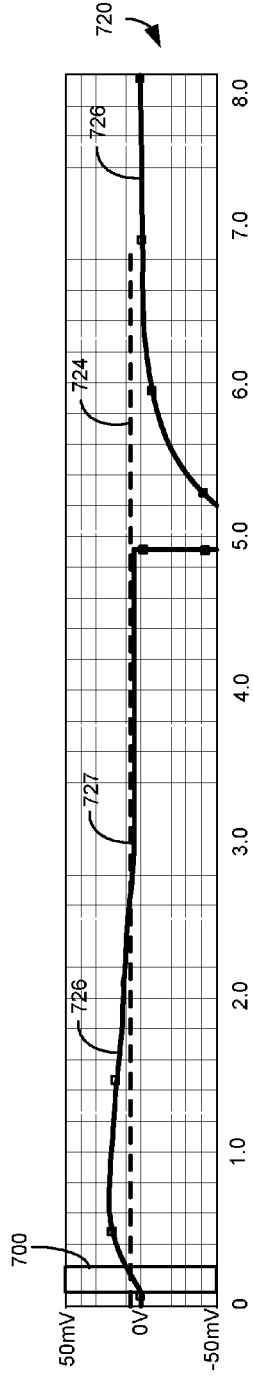
Figure 7C:
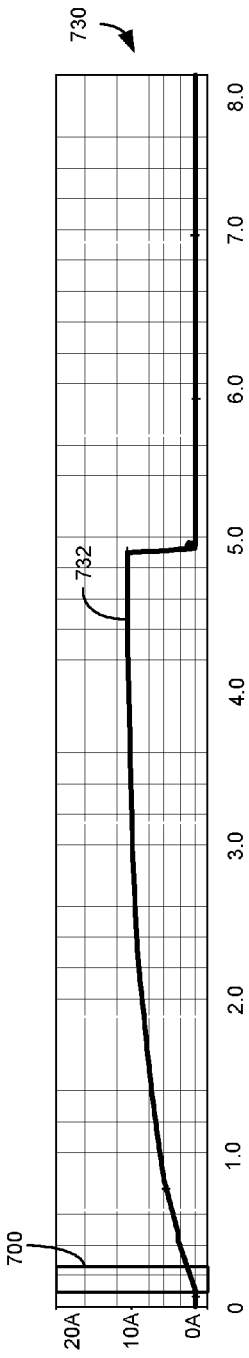

The control IC 110 can also be used to detect charging saturation of the ignition coil 130, such as illustrated by the example simulation results shown in FIGS. 7A-7C. Briefly, charging saturation of the ignition coil 130 can be detected by a primary current slope change (as indicated in FIG. 7B) in combination with an output voltage of the control IC 110 that is applied to a gate terminal of the ignition IGBT (gate voltage). If the gate voltage being applied by the control IC 110 (upon detection of charging saturation) is not controlling the ignition IGBT in the linear mode, then charging saturation can be detected based on a zero, or near-zero slope of the primary winding current that is below a lower limit.

For instance, the control IC 110 may determine that charging saturation of the ignition coil has occurred based on the current slope detection circuit 210 determining that a slope is less than a slope expected during normal operation (e.g., indicating charging saturation). On detecting charging saturation, the control IC 110 can indicate this to the ECU 118, e.g., using a flag signal (not shown), using current feedback on the terminal 111, and/or using another signaling approach. In response to such an indication of charging saturation, the ECU 118 can adjust the dwell time (for charging the ignition coil) or reduce a peak current through active control of the ignition IGBT 120, which can improve performance of the ignition circuit 100 and/or prevent electrical overstress (EOS) damage to components of the ignition circuit 100 (e.g., the ignition coil, the ignition IGBT, etc.). For instance, EOS damage can cause damage to an integrated circuit due to localized heating as a result of excessive current. EOS damage can include, e.g., melted or vaporized conductors, metal spiking into transistor junctions, etc.

Figure 8A:
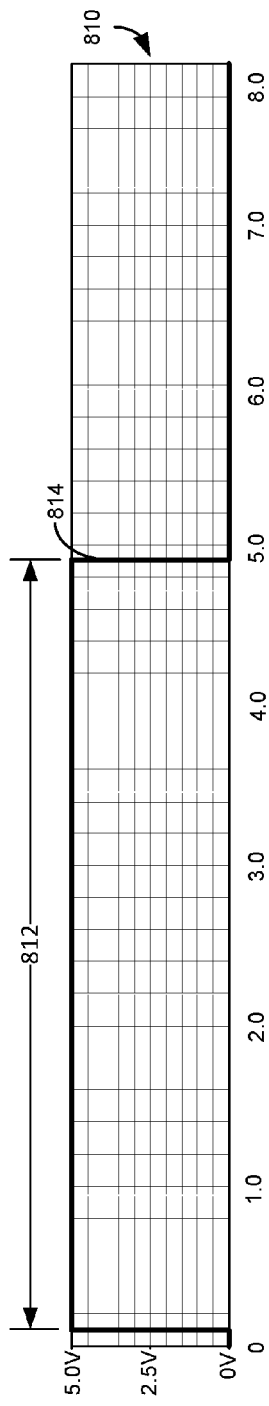
FIGS. 8A-8C are graphs illustrating operation of the ignition circuit of FIG. 1 when implemented with the control circuit of FIG. 2A and the slope detection circuit of FIG. 3 during detection of a shorted ignition coil or detection of magnetic core saturation of a secondary ignition coil winding, according to an implementation.
Figure 8B:
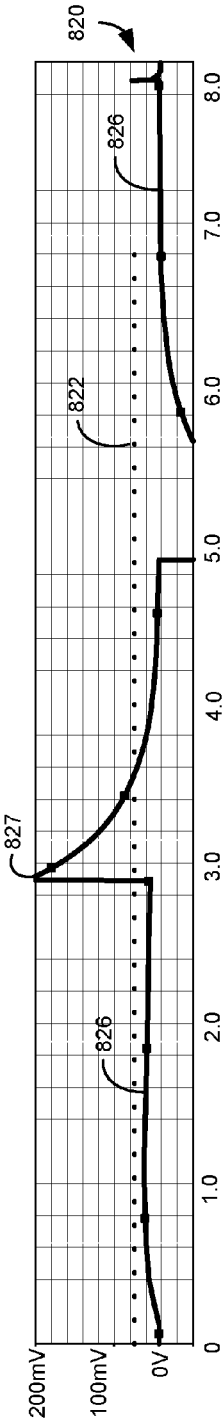
Figure 8C:
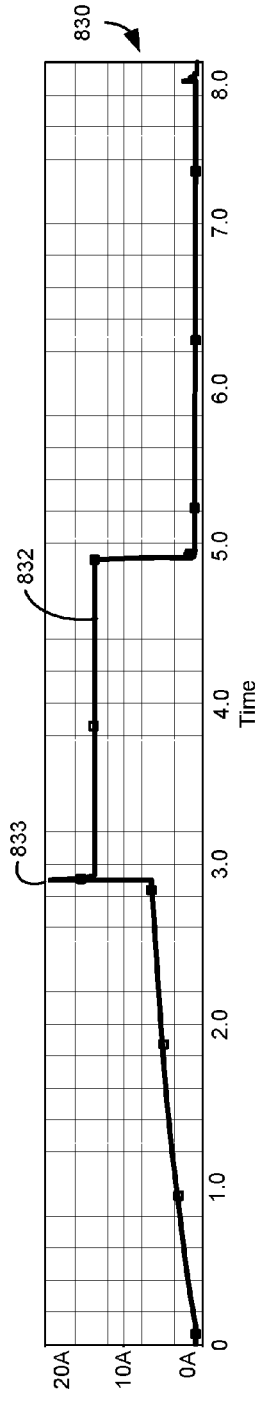

The control IC 110 in FIG. 2A can also be used to detect a short-circuit failure in the ignition coil and/or detect magnetic saturation of the ignition coil, such as is shown by the example simulation results illustrated in FIGS. 8A-8C. Short-circuit failure, or magnetic core saturation of an ignition coil can cause a sudden increase of the primary current of the ignition coil 130 during the ignition IGBT dwell time (e.g., the time during which the ignition coil is charged during normal operation). Such a change in current slope (e.g., indicated by a nearly vertical slope of the primary current) can be detected by, e.g., the current slope detection circuit 210 determining that the upper limit has been violated and the comparator 260 indicating that the sense voltage on the terminal 114 is above a reference value corresponding with a current limit value for differentiating between failure modes.

In some implementations, in response to detecting a short-circuit failure in the ignition coil and/or magnetic saturation of the ignition coil 130, the control IC 110 can send a signal to the ECU 118 to indicate the detected condition, and the ECU 118 can adjust the command signal to control operation of the IGBT to limit the primary winding current and/or turn off the ignition IGBT to protect the rest of the ignition system 100 from damage, or to prevent a dangerous condition, such as a fire from occurring. In other implementations, the control IC 110 can be configured to control operation of the IGBT to limit the primary winding current and/or turn off the ignition IGBT.

In some implementations, detection of improper operation and/or failure modes as described herein can be used in connection with the SSD circuit 250 of the control IC 110. In other words, current limiting or soft-shut-down (SSD) functions can be performed in response to detection of improper operation and/or failure modes based on detection of unexpected changes (as compared to normal operation) in a slope the primary winding current. Performing SSD in response to detection of improper operation and/or failure modes, such as described herein, may be advantageous because once charging saturation or magnetic core saturation of an ignition coil occurs, energy (current) that is drawn from battery will be almost entirely consumed in the ignition IGBT and/or the primary winding of ignition coil itself, and won't further charge the ignition coil. Accordingly, such additional energy won't be used to ignite fuel mixture when spark is initiated, causing inefficient use of energy. Further, consuming such additional energy once charging saturation and/or magnetic saturation occurs can increase the possibility of EOS failures in the ignition coil 130 and/or the ignition IGBT device 122.

In such approaches, after charging saturation and/or magnetic core saturation of the ignition coil is detected, the control IC 110 can regulate operation of the ignition IGBT 120 so as to operate in a current limiting (e.g., linear operation) mode and/or send an indication signal to the ECU 118, and the ECU 118 can regulate operation of the ignition IGBT in response to the indication. Further, after a specific time period of unusual (unexpected) primary current slope change is detected, the ECU 118 (or the control IC 110) can determine if the ignition IGBT 120 should be operating in a current limiting mode, or turned off in a controlled manner (e.g., gradually to prevent large voltage spikes on the ignition coil's secondary side), using the SSD circuit 250, to protect the ignition IGBT, ignition coil and the rest of the ignition system.

FIGS. 2B and 2C are logic flow diagrams that can be implemented by the control circuit 210 of FIG. 2A to identify failure modes of the ignition circuit 100, according to implementations, and will be described with reference to FIG. 2A. The logic flows, depending on the particular embodiment, can be implemented by hardware, software, firmware, or a combination thereof. Further, as with FIG. 2A, the logic flows of FIGS. 2B and 2C can be implemented in the ignition circuit 100 of FIG. 1. Accordingly, for purposes of illustration and example, the logic flow diagrams of FIGS. 2B and 2C are described with further reference to FIG. 1.

The logic flows diagrams of FIGS. 2B and 2C can be implemented by the control circuit 110 of FIG. 2A (e.g., by the current slope detection circuit 210 and/or by the IGBT circuit 220) when, respectively, an upper limit is violated (e.g., as indicated by the signal 270 being set to logic 1) or a lower limit is violated (e.g., as indicated they signal 280 being set to logic 1). If neither of the signals 270 or 280 in FIG. 2A is set to logic 1, the control circuit 110 can determine that the ignition circuit 100 is operating normally and that implementation of the logic flows of FIGS. 2B and 2C to determine a failure mode type or a cause of improper operation is not presently required.

In FIG. 2B, at block 221, the current slope detection circuit 210 may determine that an upper limit has been violated and indicate that determination by setting the signal 270 to logic 1. The upper and lower limits can be configured so that if the upper limit is violated, the lower limit cannot be violated, as a slope (or change in slope) of a primary current in the ignition coil 130 cannot simultaneously be above a properly established upper limit and below a properly established lower limit (e.g., where a value of the upper limit is greater than a value of the lower limit).

At block 222 of the logic flow in FIG. 2B, a determination can made (e.g., based on an output of the comparator 260) whether a value of a sense voltage on the terminal 114 is above or below a reference voltage corresponding with a predetermined current limit (where the reference voltage is applied to the terminal 262 of the comparator 260 and is used to distinguish between different failure modes and/or types of improper operation of the ignition circuit 100). If the sense voltage is not above the current limit reference voltage, the IGBT circuit 220 can, at block 223, determine, based on the signal 270 and the output of comparator 260, that a pre-ignition event may have occurred (as in FIGS. 6A-6C). If, however the sense voltage applied to the terminal 114 is above the current reference voltage on the terminal 262, the IGBT circuit 220 (or other circuit) can, at block 224, determine that, based on the signal 270 and the output of comparator 260, a coil short or magnetic saturation of the ignition coil 130 may have occurred (as in FIGS. 8A-8C).

Figure 3:
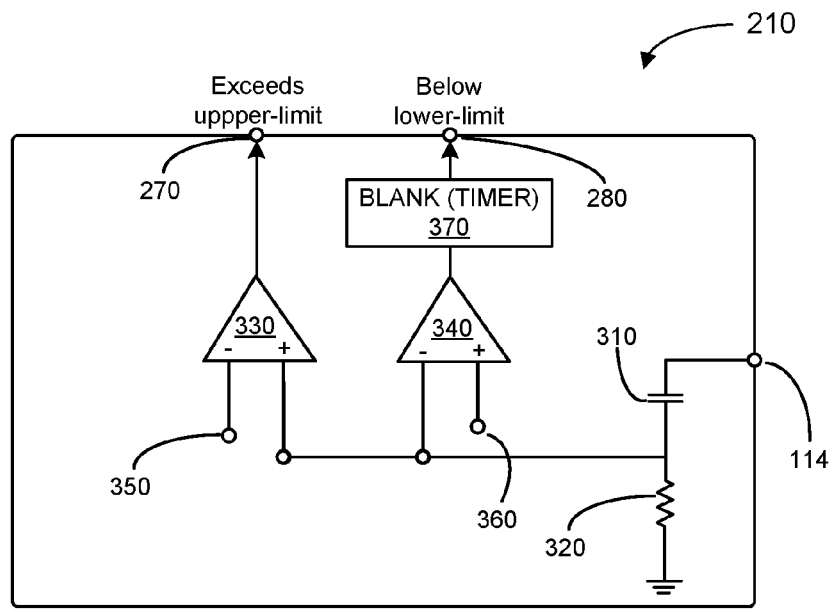
FIG. 3 is a schematic/block diagram of an analog slope detection circuit that can be included in the control circuit of FIG. 2A, according to an implementation.

FIG. 3 is schematic/block diagram illustrating an example implementation of a current slope detection circuit that can be implemented as the current slope detection circuit 210 in the control IC 110 of FIG. 2A, according to an implementation. The circuit 210 in FIG. 3 can be used in conjunction with a voltage reference circuit 400 shown in FIG. 4 to provide indications (using the exceeds upper-limit signal 270 and the below lower-limit signal 280) of detected changes in primary winding current slope (e.g., in the ignition coil 130), where those detected changes can indicate improper operation and/or failure modes of the ignition circuit 100, such as those described herein.

The simulation results in FIGS. 5A-8C were obtained from a simulation of the ignition circuit 100 of FIG. 1 implemented with the slope detection circuit 210 of FIG. 3 (using reference voltages provided using the voltage reference circuit 400) being implemented in the circuits of FIGS. 1 and 2. As an alternative, these simulation results could also be obtained using preset reference voltages (e.g. that could be provided by the regulator 240). While not discussed herein, similar simulation results could be obtained for the current slope detection circuits of FIGS. 9 and 11 (implemented with their respective voltage reference circuits shown in FIGS. 10 and 12).

As illustrated in FIG. 3, the circuit 210 includes an RC circuit including a capacitor 310 ($C_{slope}$), a resistor 320 ($R_{slope}$), and comparators 330 and 340, which can detect changes in primary current slope based on a comparison of a voltage across the resistor 320 with respective reference voltages applied to the terminal 350 of the comparator 330 (which can be referred to as $V_{REF1}$ representing the upper limit) and to the terminal 360 of the comparator 340 (which can be referred to as $V_{REF2}$ representing the lower limit). The reference voltages provided on the terminals 350 and 360 of the circuit in FIG. 3 are indicated in the simulation results shown in FIGS. 5A-8C, as appropriate. As noted above, depending on the specific implementation, these reference voltages could be preset direct-current (DC) voltages, or could be voltages (AC and/or DC voltages) that are generated by the circuit of FIG. 4.

In an implementation that includes the circuit of FIG. 3 (with or without the circuit of FIG. 4) in the circuits of FIGS. 1 and 2A, the voltage across the resistor 180 of FIG. 1 may be proportional to a primary current of the ignition coil 130. In such an approach, any sudden change of primary current (expected or unexpected) will result in voltage change across the resistor 180, since the voltage of the capacitor 310 cannot change abruptly. In such an arrangement, when a voltage across the resistor 320 is detected to be higher than the reference voltage on the terminal 350 or lower than the reference voltage on the terminal 360 (e.g., if the IGBT not operating in linear operation mode), the control IC 210 of FIG. 3 can be configured to report such detection to an ECU, or to actively control the ignition IGBT to prevent EOS damage and or hazardous conditions from occurring.

The circuit 210 can include a timer circuit 370 (which can be referred to as a blank circuit), which can be configured to ignore a sudden change of primary winding current that may occur at the beginning of ignition coil 130's dwell period. Such a blank period is illustrated in FIGS. 7A-7C, but can be used in other situations. In some implementations, in addition to monitoring a slope of the primary current, a magnitude of the primary current can be monitored, e.g., by the slope detection circuit 210, (e.g., during the entire ignition cycle, including the blank period). If the primary current exceeds a threshold value, the slope detection circuit 210 (or the IGBT circuit 220) can take appropriate action(s) (e.g., signal the ECU 118 and/or actively control the ignition IGBT 120) to prevent the possible EOS damage to the ignition circuit and/or a corresponding vehicle.

In an implementation where the circuit of FIG. 3 is included in the circuits of FIGS. 1 and 2, a voltage across the resistor 320 ($R_{slope}$) can be approximately given by Equation 5 below:

$$V_{Rslope} = t * R_{SENSE} * e^{-\frac{t}{R_{slope}C_{slope}}}$$

$$= \frac{(v_{bat} - v_0)R_{SENSE}}{R_L + k}\left(1 - e^{-\frac{R_L+k}{L}t}\right)e^{-\frac{t}{R_{slope}C_{slope}}}$$

Equation 5 if it is assumed that, as determined by Equation 6:

$$V_{Rslope\_max} = V_{Rslope}(t_{max})$$

Equation 6

In such an approach, a time to reach a maximum voltage across $R_{slope}$ can be determined by Equation 7 below:

$$t_{max} = \frac{L * \ln[(R_L + k)R_{slope}C_{slope} + L]}{R_L + k}$$

Equation 7

Figure 4:
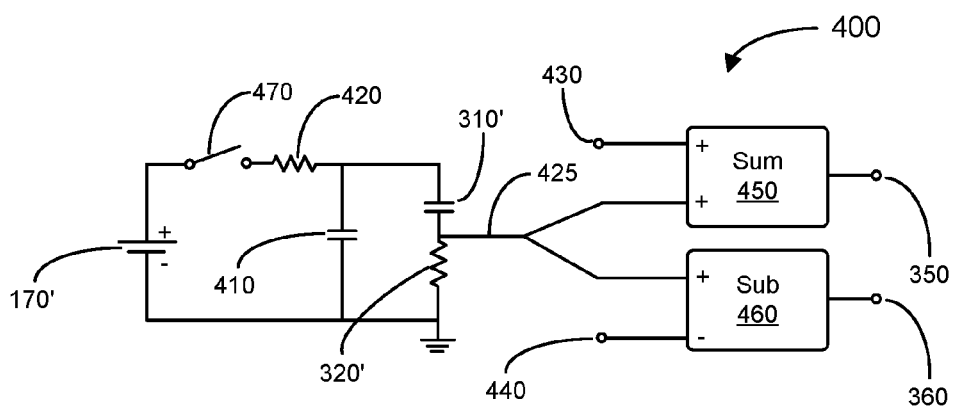
FIG. 4 is a schematic/block diagram of a circuit that can be used to generate reference voltages for the slope detection circuit of FIG. 3, according to an implementation.

FIG. 4 is a schematic diagram illustrating a circuit 400 that can be used to generate the reference voltages for the circuit 210 in FIG. 3. The circuit 400 includes a voltage supply 170', a capacitor 410 ($C_{charge}$), a resistor 420, ($R_{charge}$), a capacitor 310' (e.g., with a same value as the capacitor 310) and a resistor 320' (e.g., with a same value as the resistor 320). A switch 470 of the circuit 400 may be configured to operate in synchronization with the control signal provided by the ECU 118 on terminal 111 of the ignition circuit 110. These elements of the circuit 400 can be used to generate a reference voltage on the terminal 425 that represents the voltage across the resistor 320 ($V_{Rslope}$) under normal operating conditions of the ignition circuit 110. A first DC voltage applied to a terminal 430 is then added, by a summation circuit 450, to the voltage signal on the terminal 425, to produce the upper-limit reference signal on the terminal 350. Similarly, a second DC voltage applied to a terminal 440 is then subtracted, by a subtraction circuit 450, from the voltage signal on the terminal 425, to produce the lower-limit reference signal on the terminal 360.

FIGS. 5A to 5C are graphs (plots) 510, 520 and 530 illustrating normal operation of the ignition circuit 100 implemented with the circuits 200, 300 and 400, e.g., after an expected spike of primary winding current (e.g., at the beginning of the dwell time period). In FIGS. 5A-8C, the time scales on the x-axis are labeled with generic time units. In an embodiment, these time units could be milliseconds.

In the graph 510, a time period 512 indicates the ignition coil 130's dwell period and trace 514 illustrates an example control signal that can be received from an ECU to define the dwell period (e.g., for controlling the IGBT device 122 and other elements of the ignition circuit 100). A time period 516 and a trace 518 indicate occurrence of an ignition event when the ignition circuit 100 is operating normally.

In FIG. 5B, the traces 522 and 524 indicate, respectively, the upper limit and the lower limit used by the circuit 210 in FIG. 3, and the trace 526 illustrates the voltage across the resistor 320 in FIG. 3, which corresponds with a slope of the primary current in the ignition coil 130. In FIG. 5C, the trace 532 illustrates the primary current of the ignition coil 130 during a normal ignition cycle. As shown, in FIGS. 5B and 5C (after an initial settling period, such as a blank period 700 illustrated in FIGS. 7A-7C, at the beginning of the dwell period) the voltage across the resistor 320 (trace 526) remains within the upper and lower limits (traces 522 and 524) and the primary current (532) increases gradually until occurrence of the ignition event, when the voltage and primary current both drop as a result of the ignition event. As shown in FIG. 5B, a minimum voltage across the resistor 320, during the dwell period, can occur at the end of the dwell period.

As indicated above, FIGS. 6A-8C show simulation results that illustrate, in the ignition circuit 100, occurrence of a pre-ignition event (FIGS. 6A-6C), occurrence of primary winding charging saturation in the ignition coil 130 (FIGS. 7A-7C), and occurrence of a shorted ignition coil and/or magnetic saturation of the ignition coil 130 (FIGS. 8A-8C). These failure modes, or occurrences of improper operation can be detected (using analog current detection) using the control IC 110 when implemented using the circuit of FIG. 3 (e.g., in combination with circuit of FIG. 4 or using preset DC reference voltages) or the circuit of FIG. 9 (e.g., in combination with the voltage reference circuit of FIG. 10). In other implementations, other current slope detection circuits and/or voltage reference circuits can be used to implement the ignition circuit 110 of FIG. 1 and the control IC of FIG. 2A.

In FIG. 6A, the time period 612 and the trace 614, as with the time period 512 and the trace 514 in FIG. 5, illustrate, respectively, the dwell period and ECU control signal for the ignition circuit 100. The time period 616 and the trace 618 represent occurrence of a pre-ignition event, where the rising edge of the trace 618 illustrates the start of a pre-ignition event before the end of the dwell time period 612. In FIG. 6B, the trace 622 illustrates the upper limit (e.g., on terminal 350) in FIG. 3 and the trace 626 illustrates the voltage across the resistor 320. A rise 627 in the trace 626 corresponds with the start of the pre-ignition event and violates the upper limit (such as was described with respect to FIGS. 2A-2B). As shown in FIG. 6C, the trace 632 illustrates the primary current in this example, with an increase 633 in the primary current slope corresponding with the start of the pre-ignition event. In this situation, the exceeds upper-limit signal (on terminal 270) in the circuit 300 would be set to logic 1 to indicate the rise 627 in the voltage across the resistor 320 and the increased slope 633 of the primary current. As discussed with respect to FIG. 2B, the output of the comparator 260 can also be examined to determine that a pre-ignition event has occurred. The ignition circuit 100 could then take appropriate action(s) in response to detection of the pre-ignition event of FIGS. 6A-6C, where the action(s) will depend on the particular implementation.

In FIG. 7A, the time period 712 and the trace 714 illustrate the dwell period and ECU control signal for the ignition circuit 100, and time period 716 and trace 718 illustrate an ignition event. In FIG. 7B, the trace 724 illustrates the lower limit (on terminal 360) in FIG. 3, and the trace 726 illustrates the voltage across the resistor 320. A drop 727 in the trace 726 below the lower limit can correspond with charging saturation (e.g., such as described with respect to FIG. 2C). As shown in FIG. 7C, the trace 732 illustrates the primary current in this example. In this situation, the below lower-limit signal (on terminal 280) in the circuit 300 would be set to logic 1 to indicate the drop 727 in the voltage across the resistor 320 below the lower limit. The ignition circuit 100 could then take appropriate action(s) in response to detection of the charging saturation, where the action(s) will depend on the particular implementation.

In FIG. 8A, the time period 812 and the trace 814 illustrate the dwell period and ECU control signal for the ignition circuit 100. In FIG. 8B, the trace 822 illustrates the upper limit (on terminal 350) in FIG. 3, and the trace 826 illustrates the voltage across the resistor 320. The sudden rise 827 in the trace 826 above the upper limit can correspond with a short in the ignition coil 130 or magnetic saturation of the ignition coil 130 (e.g., such as described with respect to FIG. 2B). As shown in FIG. 8C, the trace 832 illustrates the primary current in this example, with a sudden rise 833 in the primary current corresponding with occurrence of an ignition coil short or magnetic saturation of the ignition coil 130. In this situation, the exceeds upper-limit signal (on terminal 270) in the circuit 300 would be set to logic 1 to indicate the increase 827 in the voltage across the resistor 320 above the upper limit. As discussed with respect to FIG. 2B, the output of the comparator 260 can also be examined to determine that a coil short or magnetic saturation has occurred. The ignition circuit 100 could then take appropriate action(s) in response to detection of the charging saturation, where the action(s) will depend on the particular implementation.

Figure 9:
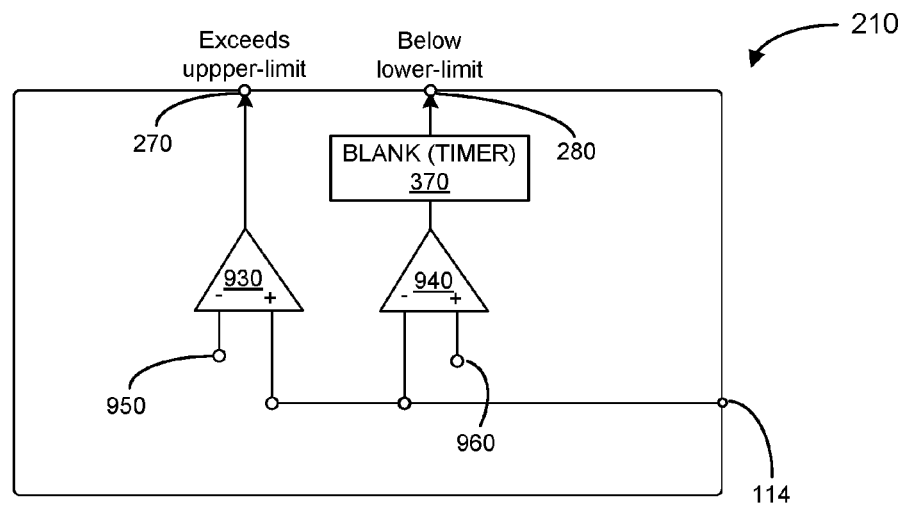
FIG. 9 is a schematic/block diagram of another analog slope detection circuit that can be included in the control circuit of FIG. 2A, according to an implementation.
Figure 10:
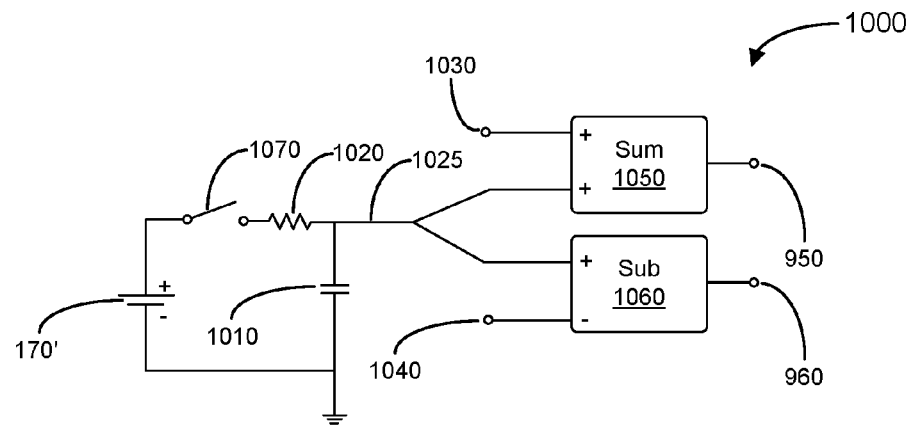
FIG. 10 is a schematic/block diagram of a circuit that can be used to generate reference voltages for the analog slope detection circuit of FIG. 9, according to an implementation.

FIG. 9 illustrates an implementation of the current slope detection circuit 210 of FIG. 2A that is similar to the current slope detection circuit 210 shown in FIG. 3 (omitting the capacitor 310 and the resistor 320). Likewise, FIG. 10 illustrates a circuit 1000 for generating reference voltages for the circuit of FIG. 9 that is similar to the circuit 400 in FIG. 4 (omitting the capacitor 310' and the resistor 320').

The circuit of FIG. 9 includes comparators 930 and 940, upper-limit signal terminal 950, lower-limit signal terminal 960 and blank (timer) 970, which correspond with the like numbered 300 series elements of FIG. 3. The circuit of FIG. 9 also includes the exceeds upper-limit signal terminal 270, the below lower-limit signal terminal 280 and the terminal 114 (e.g., $V_{SENSE}$).

The circuit 1000 includes a supply voltage 170' (e.g., adapted from the battery voltage 170), a capacitor 1010, a resistor 1020, a reference voltage terminal 1025, DC voltage terminals 1030 and 1040, a summation circuit 1050 and a subtraction circuit 1060, where the 1000 series elements correspond with the like numbered 400 series elements of FIG. 4. The circuit 1000 can be used to produce the upper-limit and lower-limit reference voltages on the terminals 950 and 960, respectively, similar to the operation of FIG. 4 in producing the reference voltages on the terminals 350 and 360 in FIG. 3.

Figure 11:
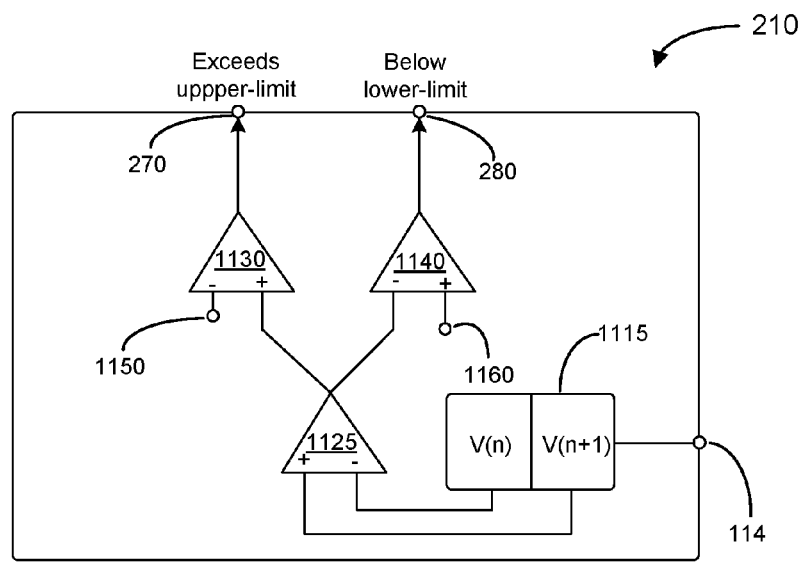
FIG. 11 is a schematic/block diagram of a digital slope detection circuit that can be included in the control circuit of FIG. 2A, according to an implementation.

FIG. 11 is a schematic/block diagram of a current slope detection circuit 210 that uses digital current slope detection. The circuit 210 of FIG. 11 can be implemented in the control IC 110 of FIG. 2A, which can in turn be implemented in the ignition circuit 100. In such an approach, the circuit 210 of FIG. 11 can be used (e.g., in conjunction with the voltage reference circuit shown in FIG. 12) to detect (using digital slope detection) improper operation and/or failure modes (such as those described herein) in the ignition circuit 100.

In an implementation, the circuit 210 of FIG. 11 may include a sampling circuit 1115 that is configured to save (digital) values (e.g., using analog-to-digital conversion) indicating a primary winding current for a series of consecutive sampling cycles, e.g., during a dwell period. In implementations, the sampling cycle can be on the order of several microseconds to hundreds of microseconds, where the specific sampling cycle will depend on the specific implementation. At a given sampling cycle, an unexpected change of current slope can be determined based on a difference between any two sequential sampled current values (shown as $V_{(n)}$ and $V_{(n+1)}$. While not shown in FIG. 11, a blank timer circuit could also be included, or a blank period can be implemented in other ways.

Figure 12:
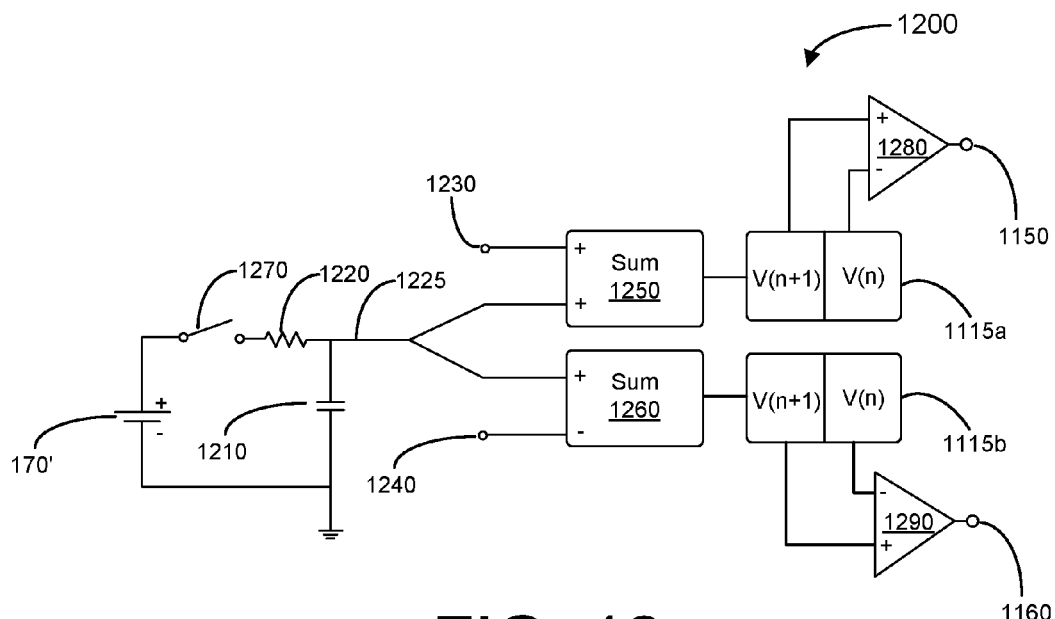
FIG. 12 is a schematic/block diagram of a circuit that can be used to generate reference voltages for the digital slope detection circuit of FIG. 11, according to an implementation.

In the circuit of FIG. 11, the reference voltages on terminals 1150 (upper limit) and 1160 (lower limit) could be pre-set DC voltages or could be DC voltages that are generated by voltage reference circuit of FIG. 12, where the reference voltages are scaled based on the sampling period. In the circuit of FIG. 11, consecutive samples stored in the sampling circuit 1115 (e.g., after digital-to-analog conversion) can be compared using a comparator 1125, where an output of the comparator 1125 represents a slope of primary current in the ignition coil 130 of the ignition circuit 100. The output of the comparator 1125 can then be compared with the upper-limit by the comparator 1130 and the lower limit 1140 by comparator 1140 to determine whether either limit has been violated.

As shown in FIG. 12, the voltage reference circuit 1200 can include a supply voltage 170' (e.g., adapted from the battery voltage 170), a capacitor 1210, a resistor 1220, a reference voltage terminal 1225, DC voltage terminals 1230 and 1240, a summation circuit 1250 and a subtraction circuit 1260, where the 1200 series elements correspond with the like numbered 1000 series elements of FIG. 9. The circuit 1200 can be used to produce the upper-limit and lower-limit reference voltages, respectively, on the terminals 1150 and 1160 using sampling circuits 1115a and 1115b, comparator 1280 and comparator 1290.

In the approaches described herein, because a slope of the ignition coil 130's primary winding current (after the blank period) can decrease during normal charging (e.g., the dwell period), the upper limit (on terminal 1150) for digital current slope detection may be more tightly set than the lower limit (on terminal 1160). For instance, because an expected maximum primary current slope can be determined using the above equations, the upper limit can be set by considering an expected decrease of slope during the blank period, which can facilitate accurate detection of pre-ignition events, coil shorts and magnetic saturation. In comparison, because the current slope can decay during a primary winding dwell time, the lower limit, which can be used to detect failure modes like charging saturation, that may be considered to be less critical than short circuits, magnetic core saturation and pre-ignition (where there is sudden jump of current slope), could be set based on a given implementation's requirements.

In an implementation, a circuit for controlling operation of an ignition circuit including an insulated-gate bipolar transistor (IGBT) device can include a current slope detection circuit configured to detect a slope of a current in a primary winding of an ignition coil included in the ignition circuit and a driver circuit coupled with the current slope detection circuit. The current slope detection circuit can be further configured to, during charging of the ignition coil, if the detected slope is above a first limit, provide a first indication to the driver circuit; and, if the detected slope is below a second limit, provide a second indication to the driver circuit. The driver circuit can be configured to, in response to receiving the first indication or the second indication, modify operation of the ignition circuit.

Implementations can include one or more of the following features. For example, modifying operation of the ignition circuit can include limiting a current through the IGBT. Modifying operation of the ignition circuit can include modifying a dwell time of the ignition circuit. The circuit can include a soft-shutdown (SSD) circuit coupled with the driver circuit. Modifying operation of the ignition circuit can include the driver circuit instructing the SSD circuit to perform a controlled shutdown of the IGBT device. The driver circuit can be further configured, in response to receiving the first indication or the second indication, to send a notification of a failure mode to an engine control unit (ECU) coupled with the ignition circuit. The ECU can be configured to modify operation of the ignition circuit bused on the notification.

The current slope detection circuit can include a resistive-capacitive circuit configured to produce a signal corresponding with the slope of the current in the primary winding, a first comparator configured to compare the signal corresponding with the slope of the current in the primary winding with a first reference voltage corresponding with the first limit and a second comparator configured to compare the signal corresponding with the slope of the current in the primary winding with a second reference voltage corresponding with the second limit. The current slope detection circuit can include a timer circuit configured to prevent the current slope detection circuit from indicating that the detected slope is above the first limit during a first portion of a dwell time of the ignition circuit.

The circuit can include a voltage reference circuit configured to provide a first reference voltage corresponding with the first limit and provide a second reference voltage corresponding with the second limit.

The current slope detection circuit can include a first comparator configured to compare a voltage signal corresponding with the slope of the current in the primary winding with a first reference voltage corresponding with the first limit and a second comparator configured to compare the voltage signal corresponding with the slope of the current in the primary winding with a second reference voltage corresponding with the second limit. The current slope detection circuit can include a timer circuit configured to prevent the current slope detection circuit from indicating that the detected slope is above the first limit during a first portion of a dwell time of the ignition circuit.

The current slope detection circuit can include a sampling circuit configured to store a first digital value corresponding with a first value of a voltage signal corresponding with the slope of the current in the primary winding at a first time and store a second digital value corresponding with a second value of the voltage signal corresponding with the slope of the current in the primary winding at a second time, the second time being a period of time after the first time. The current slope detection circuit can include a first comparator configured to comparing the first digital value with the second digital value to produce an output signal, a second comparator configured to compare the output signal with a first reference voltage corresponding with the first limit and a third comparator configured to compare the output signal with a second reference voltage corresponding with the second limit. Comparing the first digital value with the second digital value can include comparing a voltage corresponding with the first digital value and a voltage corresponding with the second digital value. The circuit can include a voltage reference circuit configured to provide a first reference voltage corresponding with the first limit and provide a second reference voltage corresponding with the second limit. The first reference voltage and the second reference voltage can be scaled based on the period of time between the first time and the second time.

In another implementation, an ignition circuit for use in an internal combustion engine can include an ignition insulated-gate bipolar transistor (IGBT) circuit, an ignition coil coupled with the ignition IGBT circuit, a spark plug coupled with the ignition coil and a control circuit coupled with the ignition IGBT circuit. The control circuit can include a current slope detection circuit configured to detect a slope of a current in a primary winding of the ignition coil and a driver circuit coupled with the current slope detection circuit. The current slope detection circuit can be further configured to, during charging of the ignition coil, if the detected slope is above a first limit, provide a first indication to the driver circuit and, if the detected slope is below a second limit, provide a second indication to the driver circuit. The driver circuit can be configured to, in response to receiving the first indication or the second indication, modify operation of the ignition circuit.

Implementations can include one or more of the following features. For example, the ignition IGBT circuit can include an IGBT device and a clamp configured to define a clamping voltage for the IGBT device.

The current slope detection circuit can include a resistive-capacitive circuit configured to produce a signal corresponding with the slope of the current in the primary winding, a first comparator configured to compare the signal corresponding with the slope of the current in the primary winding with a first reference voltage corresponding with the first limit and a second comparator configured to compare the signal corresponding with the slope of the current in the primary winding with a second reference voltage corresponding with the second limit. The current slope detection circuit can include a timer circuit configured to prevent the current slope detection circuit from indicating that the detected slope is above the first limit during a first portion of a dwell time of the ignition circuit.

The current slope detection circuit can include a first comparator configured to compare a voltage signal corresponding with the slope of the current in the primary winding with a first reference voltage corresponding with the first limit and a second comparator configured to compare the voltage signal corresponding with the slope of the current in the primary winding with a second reference voltage corresponding with the second limit. The current slope detection circuit further can include a timer circuit configured to prevent the current slope detection circuit from indicating that the detected slope is above the first limit during a first portion of a dwell time of the ignition circuit.

The current slope detection circuit can include a sampling circuit configured to store a first digital value corresponding with a first value of a voltage signal corresponding with the slope of the current in the primary winding at a first time and store a second digital value corresponding with a second value of the voltage signal corresponding with the slope of the current in the primary winding at a second time. The second time can be a period of time after the first time. The current slope detection circuit can include a first comparator configured to compare the first digital value with the second digital value to produce an output signal, a second comparator configured to compare the output signal with a first reference voltage corresponding with the first limit and a third comparator configured to compare the output signal with a second reference voltage corresponding with the second limit.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the claims, when appended, are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit for controlling operation of an ignition circuit including an insulated-gate bipolar transistor (IGBT) device, the circuit comprising:
    a current slope detection circuit configured to detect a slope of a current in a primary winding of an ignition coil included in the ignition circuit; and
    a driver circuit coupled with the current slope detection circuit; and
    a voltage reference circuit configured to:
        provide a first reference voltage corresponding with a first limit; and
        provide a second reference voltage corresponding with a second limit,
    the current slope detection circuit being further configured to, during charging of the ignition coil:
        if the detected slope is above the first limit, provide a first indication to the driver circuit; and
        if the detected slope is below the second limit, provide a second indication to the driver circuit,
    the driver circuit being configured to, in response to receiving the first indication or the second indication, modify operation of the ignition circuit.

2. The circuit of claim 1, wherein modifying operation of the ignition circuit includes limiting a current through the IGBT.

3. The circuit of claim 1, wherein modifying operation of the ignition circuit includes modifying a dwell time of the ignition circuit.

4. The circuit of claim 1, further comprising a soft-shutdown (SSD) circuit coupled with the driver circuit, wherein modifying operation of the ignition circuit includes the driver circuit instructing the SSD circuit to perform a controlled shutdown of the IGBT device.

5. The circuit of claim 1, wherein the driver circuit is further configured, in response to receiving the first indication or the second indication, to send a notification of a failure mode to an engine control unit (ECU) coupled with the ignition circuit, the ECU being configured to modify operation of the ignition circuit bused on the notification.

6. The circuit of claim 1, wherein the current slope detection circuit includes:
    a resistive-capacitive circuit configured to produce a signal corresponding with the slope of the current in the primary winding;
    a first comparator configured to compare the signal corresponding with the slope of the current in the primary winding with the first reference voltage corresponding with the first limit, the first limit being an upper limit; and
    a second comparator configured to compare the signal corresponding with the slope of the current in the primary winding with the second reference voltage corresponding with the second limit, the second limit being a lower limit.

7. The circuit of claim 1, wherein the current slope detection circuit further includes a timer circuit configured to prevent the current slope detection circuit from indicating that the detected slope is above the first limit during a first portion of a dwell time of the ignition circuit.

8. The circuit of claim 1, wherein the current slope detection circuit includes:
    a first comparator configured to compare a voltage signal corresponding with the slope of the current in the primary winding with the first reference voltage corresponding with the first limit; and
    a second comparator configured to compare the voltage signal corresponding with the slope of the current in the primary winding with the second reference voltage corresponding with the second limit.

9. The circuit of claim 8, wherein the current slope detection circuit further includes a timer circuit configured to prevent the current slope detection circuit from indicating that the detected slope is above the first limit during a first portion of a dwell time of the ignition circuit.

10. The circuit of claim 1, wherein the current slope detection circuit includes:
    a sampling circuit configured to:
        store a first digital value corresponding with a first value of a voltage signal corresponding with the slope of the current in the primary winding at a first time; and
        store a second digital value corresponding with a second value of the voltage signal corresponding with the slope of the current in the primary winding at a second time, the second time being a period of time after the first time;
    a first comparator configured to compare the first digital value with the second digital value to produce an output signal;

a second comparator configured to compare the output signal with the first reference voltage corresponding with the first limit; and a third comparator configured to compare the output signal with the second reference voltage corresponding with the second limit.

11. The circuit of claim 10, wherein comparing the first digital value with the second digital value includes comparing a voltage corresponding with the first digital value and a voltage corresponding with the second digital value.

12. The circuit of claim 10, wherein the first reference voltage and the second reference voltage are scaled based on the period of time between the first time and the second time.

13. An ignition circuit for use in an internal combustion engine, the ignition circuit, comprising:

an ignition insulated-gate bipolar transistor (IGBT) circuit;

an ignition coil coupled with the ignition IGBT circuit;

a spark plug coupled with the ignition coil; and a control circuit coupled with the ignition IGBT circuit, the control circuit including:

a current slope detection circuit configured to detect a slope of a current in a primary winding of the ignition coil; and a driver circuit coupled with the current slope detection circuit, the current slope detection circuit being further configured to, during charging of the ignition coil:

if the detected slope is above a first limit, provide a first indication to the driver circuit; and if the detected slope is below a second limit, provide a second indication to the driver circuit, the driver circuit being configured to, in response to receiving the first indication or the second indication, modify operation of the ignition circuit, the current slope detection circuit including:

a first comparator configured to compare a voltage signal corresponding with the slope of the current in the primary winding with a first reference voltage corresponding with the first limit; and a second comparator configured to compare the voltage signal corresponding with the slope of the current in the primary winding with a second reference voltage corresponding with the second limit.

14. The ignition circuit of claim 13, wherein the ignition IGBT circuit includes:

an IGBT device; and a clamp configured to define a clamping voltage for the IGBT device.

15. The ignition circuit of claim 13, wherein the current slope detection circuit further includes:

a resistive-capacitive circuit configured to produce the signal corresponding with the slope of the current in the primary winding.

16. The ignition circuit of claim 15, wherein the current slope detection circuit further includes a timer circuit configured to prevent the current slope detection circuit from indicating that the detected slope is above the first limit during a first portion of a dwell time of the ignition circuit.

17. The ignition circuit of claim 13, wherein the current slope detection circuit further includes a timer circuit configured to prevent the current slope detection circuit from indicating that the detected slope is above the first limit during a first portion of a dwell time of the ignition circuit.

18. The ignition circuit of claim 13, wherein the current slope detection circuit includes:

a sampling circuit configured to:

store a first digital value corresponding with a first value of a voltage signal corresponding with the slope of the current in the primary winding at a first time; and store a second digital value corresponding with a second value of the voltage signal corresponding with the slope of the current in the primary winding at a second time, the second time being a period of time after the first time;

a first comparator configured to compare the first digital value with the second digital value to produce an output signal;

a second comparator configured to compare the output signal with the first reference voltage corresponding with the first limit; and a third comparator configured to compare the output signal with the second reference voltage corresponding with the second limit.

\* \* \* \* \*